United States Patent [19]

Ogawa et al.

[11] 4,345,021
[45] Aug. 17, 1982

[54] SOLID-STATE IMAGE PICKUP ELEMENT AND PROCESS FOR FABRICATING THE SAME

[75] Inventors: Kazufumi Ogawa, Hirakata; Takao Chikamura, Kyoto; Takuo Shibata, Hirakata, all of Japan

[73] Assignee: Matsushita Electric Industrial Co., Ltd., Osaka, Japan

[21] Appl. No.: 188,580

[22] Filed: Sep. 18, 1980

[30] Foreign Application Priority Data

Sep. 25, 1979 [JP] Japan .............................. 54/123334
Sep. 25, 1979 [JP] Japan .............................. 54/123335

[51] Int. Cl.$^3$ .............................................. G03C 5/00
[52] U.S. Cl. .................................... 430/321; 430/311; 430/312; 430/313; 250/211 J; 250/578; 156/643; 156/655; 156/656; 156/661.1
[58] Field of Search ............... 430/321, 311, 312, 313; 250/211 J, 578; 156/643, 655, 656, 661.1

[56] References Cited

U.S. PATENT DOCUMENTS

| | | | |
|---|---|---|---|
| 3,858,304 | 1/1975 | Leedy et al. | 250/578 |
| 3,968,360 | 7/1976 | Monnier | 250/578 |
| 4,012,587 | 3/1977 | Ochi et al. | 250/578 |
| 4,081,841 | 3/1978 | Ochi et al. | 250/578 |
| 4,232,110 | 11/1980 | Taylor | 430/321 |

Primary Examiner—J. Travis Brown
Attorney, Agent, or Firm—Burgess, Ryan and Wayne

[57] ABSTRACT

A highly sensitive and high-density picture element solid-state image pickup element and a process for fabricating the same which is featured in (a) that in the step for patterning a photoconductive layer, a protective pattern resisting an etchant is formed by using an ultraviolet-ray-setting resin which is also used in the step for bonding a color filter and then the undesired areas of the photoconductive layer, which has been formed over the whole surface of a wafer, are removed and (b) that the color filter having a stripe or mosaic pattern is bonded to the protective pattern with the same ultraviolet-ray-setting resin. Alternatively, after the color filter has been bonded, the undesired areas of the photoconductive layer are removed with the color filter used as an etching mask.

8 Claims, 12 Drawing Figures

SOLID-STATE IMAGE PICKUP ELEMENT AND PROCESS FOR FABRICATING THE SAME

BACKGROUND OF THE INVENTION

The present invention relates to a highly sensitive and high-density solid-state image pickup element with a photoconductive layer and a process for fabricating the same.

In the solid-state image pickup element fabrication process, after metal lines and an electrode for connection of a photoconductive layer have been formed, a vacuum evaporation process with a metal mask is used to form the photoconductive layer and a transparent electrode thereover only over the surface of a picture element portion. So far only this process can provide the photoconductive layer and the transparent electrode thereover. However, with this process flaws in the metal mask, scratches left on the surface of a wafer by the metal mask when it is adjusted in position relative to the wafer and dust particles on the wafer surface cause certain devices to be less than perfect. In addition, since the vacuum deposited photoconductive layer and transparent electrode are very weak in strength, it has been extremely difficult to remove by washing saw dust particles attached to the chips when the fabricated wafer is sectioned into chips. The dust particles left over the surface of the transparent electrode causes surface flaws thereof when a color filter is bonded to the electrode. Thus the prior art fabrication process leaves many flaws and has a low yield.

SUMMARY OF THE INVENTION

In view of the above, a first object of the present invention is to provide a process for fabricating solid-state image pickup elements in which the use of a metal mask is eliminated in the step for vacuum depositing a photoconductive layer and subsequently a transparent electrode thereover so that fatal flaws and dust particle entrainment or containment which make a chip nonoperative can be minimized or substantially eliminated.

A second object of the present invention is to provide a process for fabricating solid-state image pickup elements in which an etching mask of a hardened photosetting resin which is used when the conductive layer and the transparent electrode are patterned is not removed after the etching step and is used as a protective mask when the fabricated wafer is sectioned into chips and the chips are then washed with water so that the diffusion of water into the photoconductive layer can be prevented.

A third object of the present invention is to provide a process for fabricating solid-state image pickup elements in which a color filter is bonded to said etching mask of a hardened photosetting resin so that flaws in a picture element portion can be minimized.

A fourth object of the present invention is to provide a process for fabricating solid-state image pickup element of the type described previously in which the color filter is bonded to the etching mask with the same photosetting resin so that the optical properties at the interface between the color filter and said etching pattern can be improved and at the same time a hardening time can be considerably shortened, whereby the productivity can be remarkably improved and the high yield can be ensured.

According to the present invention, in the step for patterning the photoconductive layer and the transparent electrode thereover, an etching or protective pattern is formed by the use of an ultraviolet-ray-setting resin. This etching or protective pattern is not removed even after the etching step. A stripe or mosaic color filter is bonded to this etching or protective pattern left with the same ultraviolet-ray-setting resin. Alternatively, after the color filter has been bonded, the undesired areas of the photoconductive layer and the transparent electrode layer are removed by the etching process with the color filter used as an etching mask. Thus the soid-state image pickup element fabricated by the process in accordance with the present invention is featured in that the protective layer and the layer of an adhesive agent which is completely or substantially similar in optical properties to the protective layer are sandwiched between the photoconductive layer and the color filter.

The above and other objects, effects, features and advantages of the present invention will become more apparent from the following description of preferred embodiments thereof taken in conjunction with the accompanying drawings.

CONCRETE DESCRIPTION OF THE PRIOR ART

Figure 1:
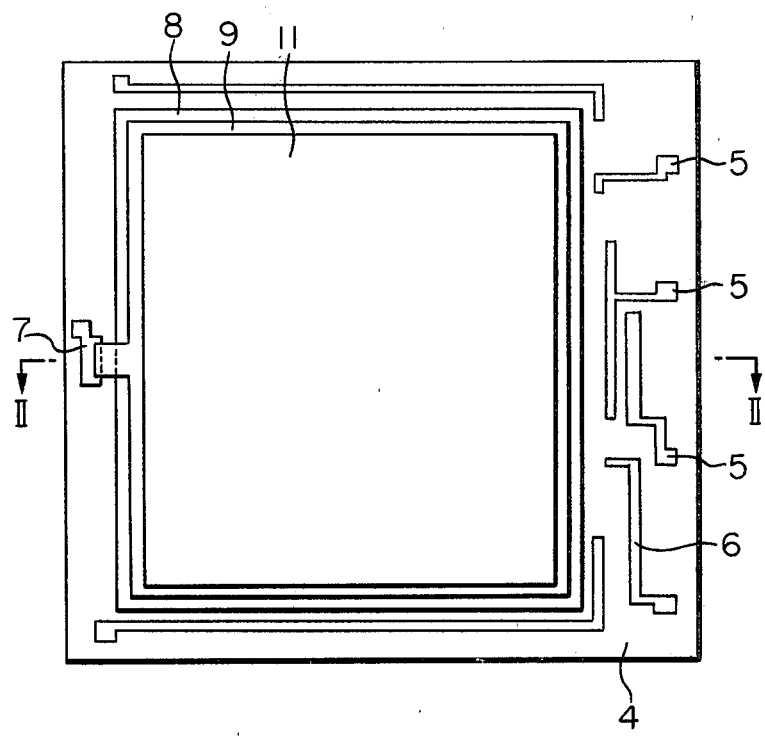
FIG. 1 is a top view of a prior art solid-state image pickup element.
Figure 2:
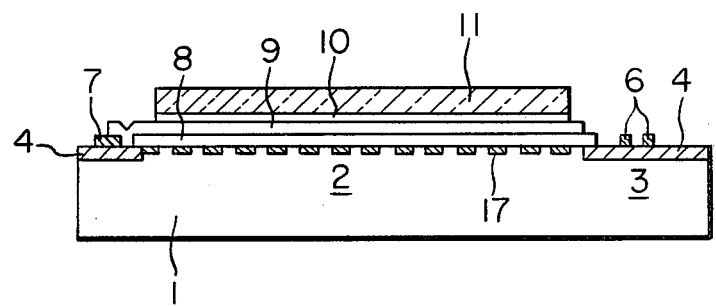
FIG. 2 is a sectional view thereof taken along the line II—II of FIG. 1.

Referring to FIGS. 1 and 2, formed over the center portion of a p-type substrate 1 is a picture element portion 2 (which will be described in detail below) consisting of photodiodes sensitive to an optical image and charge transfer or coupled elements for transferring optical signals. A driving circuit 3 such as a register or a charge-coupled device for driving the picture element portion 2 is provided around the periphery thereof and an insulating layer 4 is overlaid on the driving circuit 3. Forward over the insulating layer 4 are metal lines 6 which are connected at one ends to the terminals of the driving circuit 3 and at the other ends to pads 5 for external connection and an electrode 7 for connection of a photoconductive layer 8. The photoconductive layer 8, which consists of $ZnSe\text{-}Zn_{1-x}Cd_xTe$ or amorphous silicon, is formed over the picture element portion 2 and a transparent electrode 9 is formed over the photoconductive layer 8. Moreover, a stripe or mosaic color filter 11 is bonded through an adhesive layer 10.

Next referring to FIGS. 3 and 4, the construction of the picture element portion 2 will be described in detail. An n+ diffused region 12 and the p-type substrate 1 provide a photodiode. The n+ diffused region 13 provides a bucket bridge device BBD. When a voltage is applied to a first gate electrode 14, a charge packet is transferred from the n+ diffused region 12. Numerals 15 and 16 show insulators. An electrode 17, which is made of molybdenum or Mo, is electrically connected to the n+ diffused region 12 and serves as an electrode for the photoconductive layer 8. A second gate electrode 18 is the gate of BBD.

Figure 4:
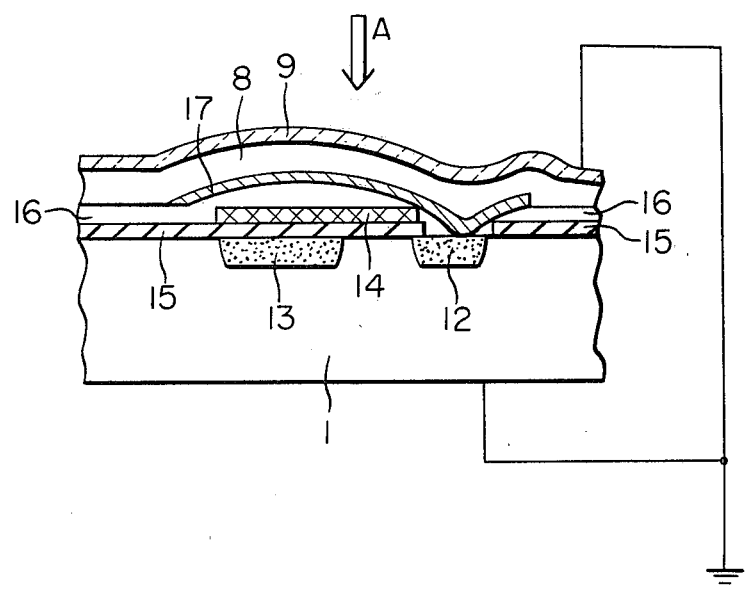
FIG. 4 is a sectional view taken along the line IV—IV of FIG. 3.
Figure 5A:
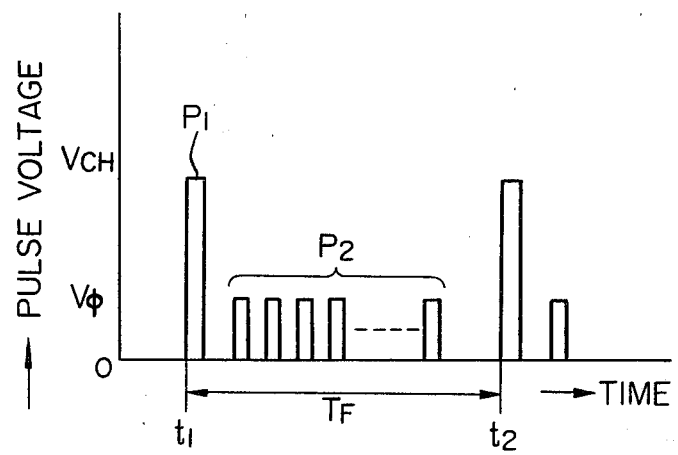
FIGS. 5A and 5B are views used for the explanation of the mode of operation of the prior art device shown in FIGS. 1 through 4.
Figure 5B:
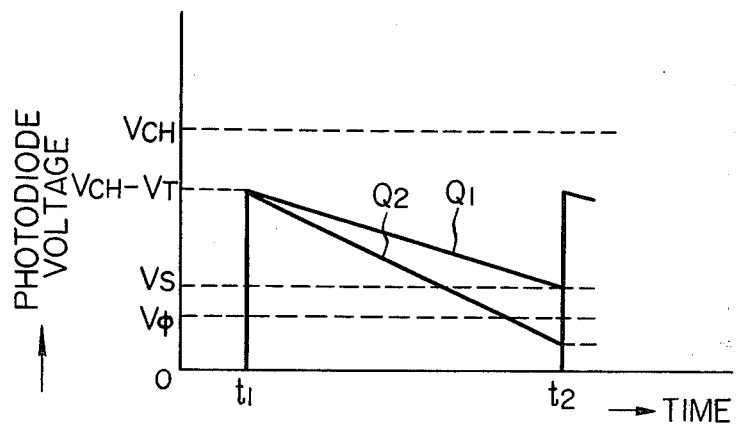

Referring further to FIG. 5, the mode of read-in operation will be described. FIG. 5A shows the drive pulse pattern while FIG. 5B, the variations in voltage in the n+ diffused region 12. At a time $t_1$, a read-in pulse $P_1$ at $V_{CH}$ is applied to the first gate electrode 14. Then as shown in FIG. 5B, the potential in the n+ diffused region 12 rises to $(V_{CH}-V_T)$, where $V_T$ is a threshold voltage of a field-effect transistor or FET consisting of the n+ diffused regions 12 and 13 and the first gate electrode 14. When the light as indicated by A in FIG. 4 impinges, electron-hole pairs are produced in the photoconductive layer 8 and electrons reach the electrode 17 while the holes, the transparent electrode 9. As a result, the potential at the n+ diffused region 12 drops and this voltage drop is in proportion to the quantity of the incident light. In FIG. 5B, the curve $Q_1$ shows the response to the normal light while the curve $Q_2$, the response to the high-intensity light. The voltage drop continues for a time interval of one field $T_F$ and reaches Vs. At $t_2$, a pulse voltage $V_{CH}$ again is applied to the first gate electrode 14. Then the surface potential of the p-type substrate 1 immediately below the electrode 14 rises, so that the transfer of electrons results from the n+ diffused region 12 to the n+ diffused region 13. Subsequently, the potential at the n+ diffused region 12 rises again to $(V_{CH}-V_T)$. Thus total amount of electrons transferred to the n+ diffused region 13 corresponds to the intensity of the incident light.

Figure 3:
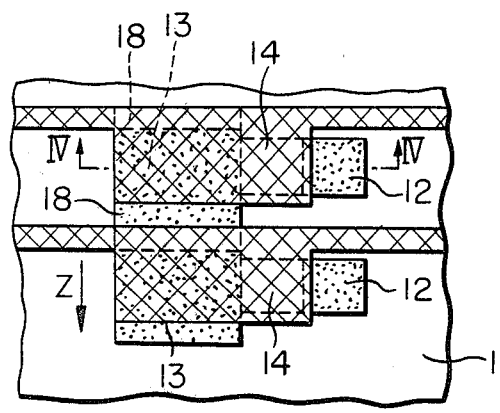
FIG. 3 is a fragmentary view thereof, on enlarged scale.

The optical information thus read into the n+ diffused region 13 is transferred in the vertical direction as indicated by Z in FIG. 3 when the pulse voltage $V_\phi$ (See FIG. 5A) is applied to the second gate electrode 18, this transfer being of the BBD type. Thus, the light signal is converted by the photodiode into the electric signal which in turn is transferred to the output stage in response to the two-phase clock signal.

In the fabrication of such solid-state image pickup element as described above, after metal lines 6 and the connection electrode 7 for the photoconductive layer 8 have been formed, the photoconductive layer 8 and the transparent electrode 9 are formed only over the picture element portion 2 by depositing the materials for the layer 8 and the electrode 9 through a metal mask to be referred to as "the mask evaporation process" in this specification.

The reasons why the mask evaporation process is used are as follows. In general, the photoconductive layer 8 is degraded in sensitivity when it contacts a solvent or water. If the photoconductive layer 8 is formed by the conventional photolithographic process using a photoresist such as KTFR or ZA1350J (both the trademarks), a solvent such as J-100 (the trademark) or fuming nitric acid must be used for removal of the remaining resist. Then the sensitivity of the photoconductive layer 8 is considerably degraded. As a result, only the mask evaporation process has been used in the fabrication. However, when the metal mask is positioned over the p-type substrate 1, the latter tends to be scratched and dust or the like tends to attach to the mask and the substrate. As a result, the completed elements have scratches and pinhole-like defects. In general, the photoconductive layer 8 and the transparent electrode 9 are very weak in strength so that it is very difficult to remove the contaminants on the transparent electrode 9 by washing or the like prior to the process for sectioning the fabricated wafer or substrate into chips. The contaminants remaining on the surface of the transparent electrode 9 bring about difficult problems when the color filter 11 is bonded to the electrode 9. In general, a space of 5 to 6 microns must be provided between the transparent electrode 9 and the color filter 11. When the color filter 11 is bonded to the transparent electrode 9, the contaminant particles are pressed against the transparent electrode 9, leaving surface flaws.

As described above, the mask evaporation process leaves many flaws so that the yield is low.

DESCRIPTION OF THE PREFERRED EMBODIMENTS

Figure 6:
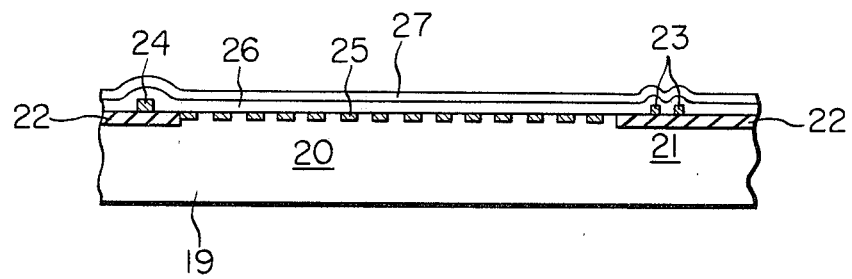
FIGS. 6 through 8 are views used for the explanation of the steps of a first embodiment of the present invention.
Figure 7:
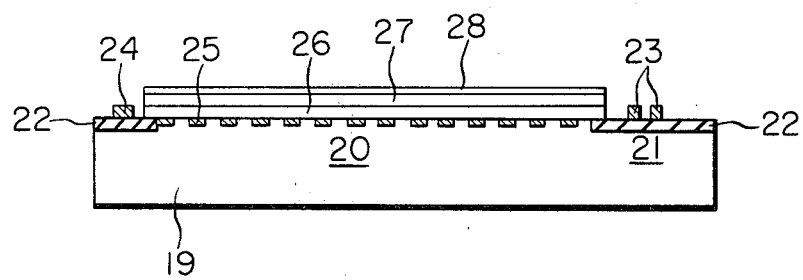
Figure 8:
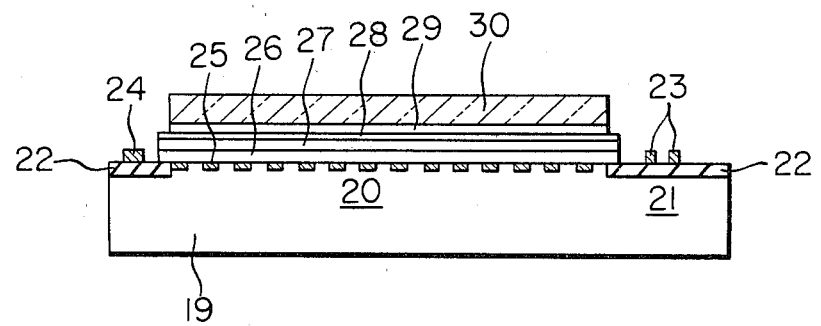

First Embodiment, FIGS. 6 through 8

As shown in FIG. 6, a picture element portion or faceplate 20 consisting of photodiodes and BBDs and a driving circuit 21 consisting of MOS transistors and CCDs are formed over the surface of a p-type silicon wafer 19 by the conventional MOS wafer fabrication process. Thereafter, an insulating layer 22 is formed and metal lines 23, a connection electrode or land 24 for a photoconductive layer 26 and a plurality of connection electrodes for interconnecting between the photodiodes and the photoconductive layer 26 are formed over the insulating layer 22.

Thereafter, the photoconductive layer 26 consisting of, for instance, $ZnSe-Zn_{1-x}Cd_xTe$ and then a transparent electrode 27 consisting of, for instance, $In_2O_3$ doped with Sn are deposited by the vacuum evaporation process over the whole surface of the wafer 19.

Next, as shown in FIG. 7, a resist such as Summers UV-74 or Norland NOA-61 (viscosity 800 cps), both trademarks, is applied over the whole surface to a thickness of from one to two micrometers by using a spinner spinning at 7000 to 8000 rpm. Thereafter, the wafer is exposed for about 60 seconds to the ultraviolet rays emitted from an ultraviolet lamp of 100 watts (W) through a quartz mask with a desired pattern. As a result, the resist pattern 28 remains only over the picture element portion 20 as an etching mask. Next, the undesired areas of the photoconductive layer 26 and the transparent electrode 27 are removed by the conventional etching process. When the photoconductive layer 26 consists of $ZnSe-Zn_{1-x}Cd_xTe$, it can be removed with 10-N nitric acid within two or three minutes. Nitric acid leaves no adverse effects on the resist pattern 28. Alternatively, the photoconductive layer 26 can be removed by sputter etching or plasma etching.

When the fabricated wafer 19 is sectioned and washed, the resist pattern 28 serves as a protective layer.

Finally, as shown in FIG. 8, a color filter 30 is bonded to the resist pattern 28 with an adhesive 29 and fine wire leads are bonded to the pads. Thus, the solid-state image pickup element is completed.

When both the photoresist pattern 28 and the adhesive layer 29 are made of the same adhesive which is hardened by the radiation of ultraviolet rays, these two layers 28 and 29 between the color filter 30 and the transparent electrode 27 have the same index of refraction, so that the optical characteristics can be improved.

In addition, a secure and stabilized bond between these layers 28 and 29 can be attained. Moreover, the bonding time can be considerably shortened.

Since conventional color filters can transmit about 10% of the light of wavelengths from 300 to 400 nm, the conventional UV hardening with the ultraviolet light of 365 nm in wavelength emitted from a high-pressure mercury lamp can be utilized.

In summary, according to the first embodiment of the present invention, the photoconductive layer and the transparent layer are deposited over the whole surface of the wafer without the use of the metal mask. As a result, the flaws caused by scratches left on the wafer when the metal mask position is adjusted or the flaws due to dust particles can be eliminated. In addition, in order to leave a predetermined pattern of the photoconductive layer and the transparent electrode, a hardened photoresist pattern is used as an etching mask. As a result, flaws can be substantially eliminated or reduced to a minimum and consequently the yield can be considerably improved. Moreover, the hardened photoresist pattern is not removed and used as a protective layer when the fabricated wafer is sectioned and washed, so that the yield can be further improved.

Figure 9:
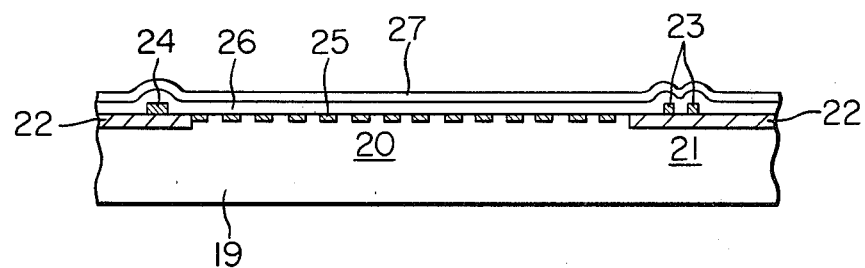
FIGS. 9 through 11 are views used for the explanation of the steps of a second embodiment of the present invention.
Figure 10:
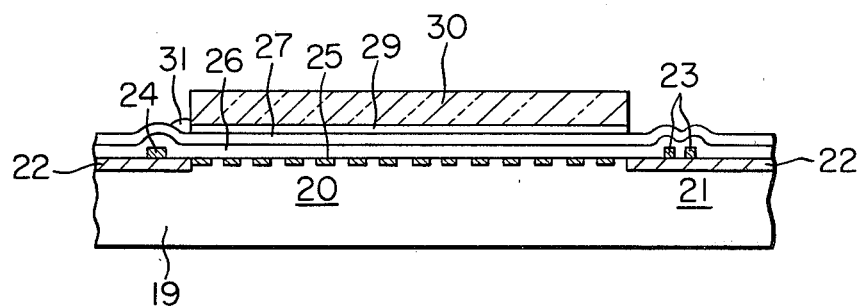
Figure 11:
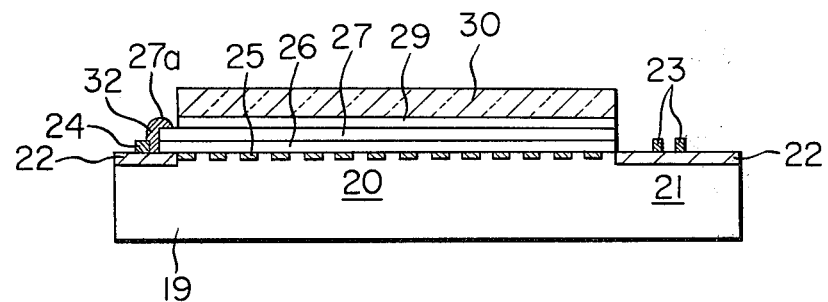

Second Embodiment, FIGS. 9 through 11

In the second embodiment, the steps for forming the picture element area or faceplate 20, the driving circuit 21, the insulating layer 22, the metal lines 23, the electrode 24 for connection of the photoconductive layer 26, the electrodes 25, the photoconductive layer 26 and the transparent electrode 27 as shown in FIG. 9 are substantially similar to those described previously in conjunction with the first embodiment.

After the transparent electrode 27 has been deposited, the adhesive 29 of the type described previously is applied over the transparent electrode 27 as shown in FIG. 10 and then the color filter 30, which has been cut into a predetermined pattern, is registered with the picture element portion 20 and bonded to the transparent electrode 27. In this case, the adhesive 29 is so applied that the spacing between the color filter 30 and the transparent electrode 27; that is, the thickness of the adhesive layer 29 becomes about 10 micrometers.

Thereafter, the adhesive squeezed out by the color filter 30 is removed by washing or $O_2$ plasma asher and then a photoresist 31 such as AZ1350J is applied to a predetermined area of the transparent electrode 27, so that the connection between the lead wire and the transparent electrode 27 may be facilitated.

Next, as shown in FIG. 11, the undesired areas of both the transparent electrode 27 and the photoconductive layer 26 are removed by etching. In this case, the color filter 30 and the photoresist 31 serve as the etching mask. Thereafter, the photoresist 31 is removed to expose the predetermined area of the transparent electrode 27. The connection between the transparent electrode 27 and the connection electrode or land 24 can be easily established by dropping silver paste or the like 32 between them. As with the first embodiment, when the photoconductive layer 26 consists of ZnSe-$Zn_{1-x}Cd_xTe$ and the transparent electrode 27 consists of $In_2O_3$, they can be removed with 10-N nitric acid within a few minutes. Instead of the wet type etching, the sputter or plasma etching can be employed.

The color filter 30 serves as a protective layer when the fabricated wafer 19 is sectioned into chips and when the chips are washed.

Thereafter, each chip is bonded to a die and the fine lead wires are bonded to the exposed portion 27a of the transparent electrode 27 and to the pads at the ends of the metal lines 23. Thus, the solid-state image pickup element is completed.

In summary, the second embodiment can also eliminate the use of the metal mask in the steps for vacuum depositing the photoconductive layer 26 and the transparent electrode 27, so that flaws and the adhesion of dust particles to the fabricated wafer can be minimized. In addition, the transparent electrode 27 is protected by the glass color filter 30, so that dust particles resulting from the process for sectioning the fabricated wafer 19 into chips can be removed in a simple manner by the conventional washing process. As a result, the yield can be considerably improved. Moreover, only one registration step is required for registering the color filter with and bonding it to the transparent electrode 27 throughout the whole fabrication process, so that the process can be much simplified and consequently the fabrication costs can be reduced.

As described above, according to the present invention, both the photoconductive layer and the transparent layer are vacuum deposited over the whole surface of the wafer without the use of the metal mask, so that the flaws and the containment of dust particles can be avoided. In order to leave the predetermined patterns of the transparent electrode and the photoconductive layer, the color filter, which has been cut into a desired pattern, is bonded to the transparent electrode as a protective layer, so that the flaws can be minimized or substantially eliminated and consequently the yield can be remarkably improved.

The solid-state image pickup element fabricated by the processes in accordance with the present invention comprises a wafer, a picture element portion formed on the wafer and adapted to sense the light image and transfer the electric signals representative of the intensities of the elemental areas of the light image, a driving circuit for driving the picture element portion, a photoconductive layer overlaid the picture element portion, a transparent electrode overlaid the photoconductive layer, a layer of a photosetting resin which has the optical properties substantially similar to those of an adhesive agent used for bonding a color filter to the transparent electrode and which is transparent to the light in the visible range, and the color filter bonded in the manner described above. The solid-state image pickup element has the high sensitivity comparable to that of the solid-state image pickup device of the type having a prior art photoconductive layer or film. In addition, it has the high-density picture elements.

What is claimed is:

1. A process for fabricating solid-state image pickup elements comprising the steps of
   preparing a wafer,
   forming on said wafer a picture element portion for sensing a light image and transferring and a driving circuit for driving said picture element portion,
   forming a photoconductive layer over the whole surface of said wafer on which are formed said picture element portion and said driving circuit, said photoconductive layer being connected to photosensor elements of said picture element portion,
   forming a transparent electrode layer over the whole surface of said photoconductive layer, applying over the whole surface of said transparent electrode layer a photosetting resin which has the optical properties substantially similar or the same as those of an adhesive agent used for bonding a color filter to said transparent electrode and is transparent to the light in the visible range, exposing said photosetting resin through a photomask having a predetermined pattern so that the hardened resin pattern is transferred at least to a predetermined portion of said transparent electrode layer corresponding to said picture element portion, and selectively etching said transparent electrode layer and said photoconductive layer with said hardened resin pattern used as an etching mask.

2. A process as set forth in claim 1 wherein said color filter is bonded to said hardened resin pattern and is used as an etching mask when said photoconductive layer and said transparent electrode layer are selectively etched.

3. A process as set forth in claim 1 wherein said photoconductive layer consists of $ZnSe\text{-}Zn_{1-x}Cd_xTe$.

4. A process as set forth in claim 1 wherein said photosetting resin is of the type which is hardened when radiated with the ultraviolet rays.

5. A process as set forth in claim 1 wherein said photoconductive layer and said transparent electrode layer are selectively etched by the wet type etching process, the sputter etching process or the plasma etching process.

6. A process as set forth in claim 2 wherein said color filter bonded to said picture element portion has a stripe or mosaic pattern.

7. A process as set forth in claim 2 wherein a second resin is applied to a predetermined portion of the area of said transparent electrode layer which is uncovered by said color filter prior to the selective etching and is removed after said selective etching, whereby said predetermined portion of said transparent electrode layer is exposed.

8. A process as set forth in claim 7 wherein said second resin is a photoresist.

* * * * *